US012666911B2

(12) United States Patent
Huang et al.

(10) Patent No.: US 12,666,911 B2
(45) Date of Patent: Jun. 23, 2026

(54) AUTOMATED MATERIAL HANDLING SYSTEM FOR USE IN POWER OUTAGE RECOVERY

(71) Applicant: Taiwan Semiconductor Manufacturing Company, Ltd., Hsinchu (TW)

(72) Inventors: Chun-Jung Huang, Yulin (TW); Y.Y. Lee, Tainan (TW); Kuang Huan Hsu, Hsinchu (TW); Li-Hsin Chu, New Taipei (TW); Jen-Ti Wang, Taichung (TW); Chieh Hsu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 994 days.

(21) Appl. No.: 17/843,228

(22) Filed: Jun. 17, 2022

(65) Prior Publication Data

US 2023/0411193 A1     Dec. 21, 2023

(51) Int. Cl.
H10P 72/30          (2026.01)

(52) U.S. Cl.
CPC ................................ H10P 72/3214 (2026.01)

(58) Field of Classification Search
CPC ................................................ H01L 21/67724
See application file for complete search history.

(56) References Cited

U.S. PATENT DOCUMENTS

| | | | | |
|---|---|---|---|---|
| 7,201,106 | B2 * | 4/2007 | Whiston ................ | B61D 15/00 |
| | | | | 105/72.2 |
| 7,925,380 | B2 * | 4/2011 | Yu ....................... | G05B 19/4189 |
| | | | | 700/121 |
| 10,564,632 | B2 * | 2/2020 | Hsu .................... | H01L 21/67727 |
| 10,940,878 | B2 * | 3/2021 | Murakami ............... | B61B 3/02 |
| 2004/0034476 | A1 * | 2/2004 | Lee ........................... | G01V 1/01 |
| | | | | 702/15 |
| 2004/0118980 | A1 * | 6/2004 | Chang ................. | H01L 21/6773 |
| | | | | 246/1 C |
| 2008/0041694 | A1 * | 2/2008 | Rebstock .............. | G03F 7/7075 |
| | | | | 198/346.2 |
| 2014/0062384 | A1 * | 3/2014 | Niizuma ............... | H02J 7/0013 |
| | | | | 320/108 |
| 2014/0142868 | A1 * | 5/2014 | Bidaud ............. | G01N 21/8803 |
| | | | | 702/34 |
| 2017/0186639 | A1 * | 6/2017 | Takai ................ | H01L 21/67769 |
| 2018/0087908 | A1 * | 3/2018 | Bailey .................... | G01C 21/20 |

(Continued)

*Primary Examiner* — Kyle O Logan
(74) *Attorney, Agent, or Firm* — Sterne, Kessler, Goldstein & Fox P.L.L.C.

(57) ABSTRACT

When there is an interruption in power to an area of an integrated circuit manufacturing facility, product may be stranded in a vehicle mounted to an automated material handling system. An automated rescue vehicle can be deployed to retrieve the stranded vehicle so that a payload carried by that vehicle can be recovered and processing can resume. The rescue vehicle can carry a battery payload. The battery payload provides backup power while the rescue operation is performed. With such an automated system, no human intervention is needed to recover product during a power outage. In addition to improving wafer throughput during the power outage, such a rescue operation may prevent quality degradation for time-critical sequences of processing operations.

20 Claims, 7 Drawing Sheets

(56)  References Cited

U.S. PATENT DOCUMENTS

| 2019/0006214 | A1* | 1/2019 | Li | H01L 21/67265 |
|---|---|---|---|---|
| 2019/0362995 | A1* | 11/2019 | Ito | G06K 7/10366 |
| 2019/0389492 | A1* | 12/2019 | Weitersberger | A62C 3/0221 |
| 2021/0098275 | A1* | 4/2021 | Li | H01L 21/67253 |
| 2021/0114639 | A1* | 4/2021 | Kinio | G01S 13/86 |
| 2021/0362957 | A1* | 11/2021 | Hagiwara | H01L 21/67259 |
| 2022/0176824 | A1* | 6/2022 | Cho | B60L 53/305 |
| 2022/0388773 | A1* | 12/2022 | Austrheim | B65G 1/0478 |
| 2023/0127674 | A1* | 4/2023 | Hammerl | B61L 27/70 |
| | | | | 246/122 R |
| 2024/0032458 | A1* | 2/2024 | Xu | A01G 9/26 |

* cited by examiner

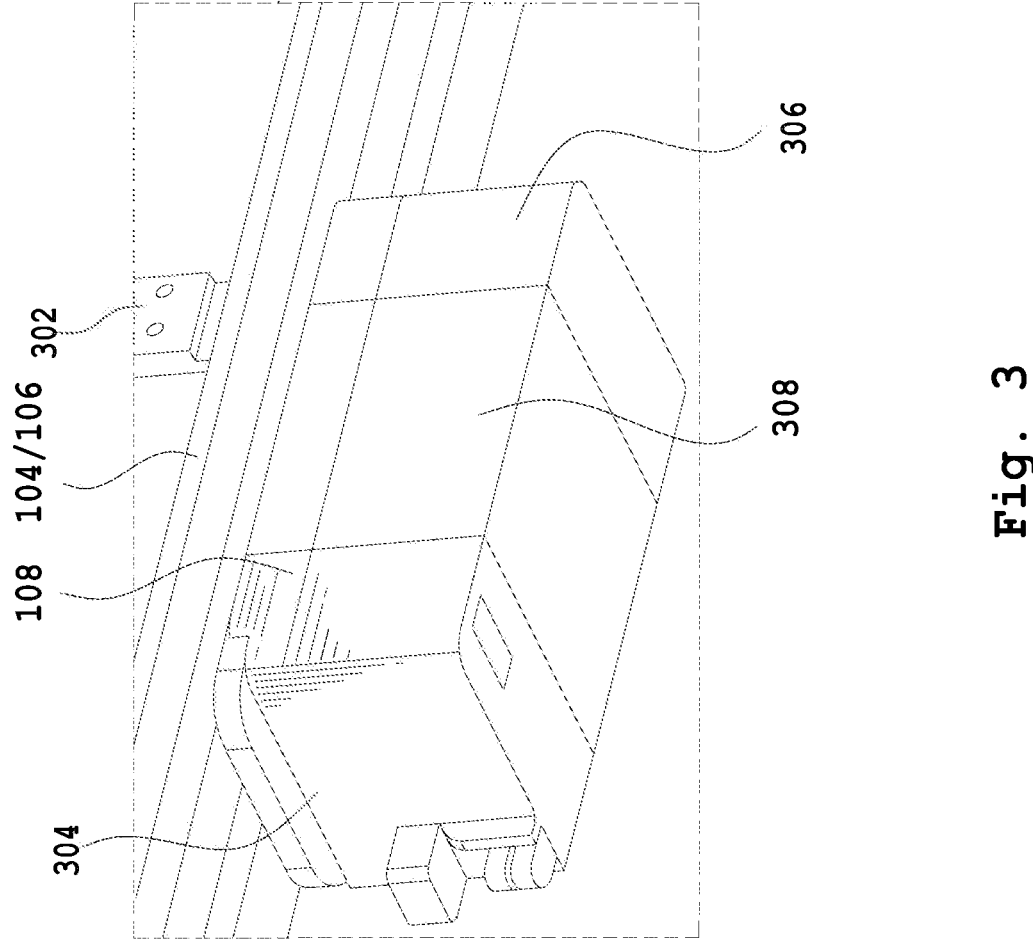
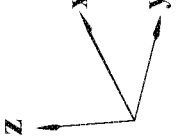
Fig. 3

602 — Detect power outage affecting a powered down area

604 — Detect presence of product vehicle(s) within powered down area

606 — Perform power and/or range calculations

608 — Deploy rescue vehicle(s) to powered down area

610 — Unload goods from product vehicle (optional)

612 — Rescue vehicle links to product vehicle

614 — Rescue vehicle tows product vehicle away from powered down area

616 — Product vehicle couples to powered rail

618 — Rescue vehicle de-couples from product vehicle

AUTOMATED MATERIAL HANDLING SYSTEM FOR USE IN POWER OUTAGE RECOVERY

BACKGROUND

With advances in robotics technology, there has been increasing demand for factory automation to reduce the need for manual labor in microelectronics factories. To meet this demand, automated material handling systems (AMHSs) have become more sophisticated to further reduce the need for human intervention in both routine and emergency procedures.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIG. 3 is a pictorial perspective view of an overhead transport vehicle configured to draw power from a rail, in accordance with some embodiments of the present disclosure.

FIG. 6 is a flow diagram of an automated method for recovering from a power outage, in accordance with some embodiments of the present disclosure.

DETAILED DESCRIPTION

Figure 1:
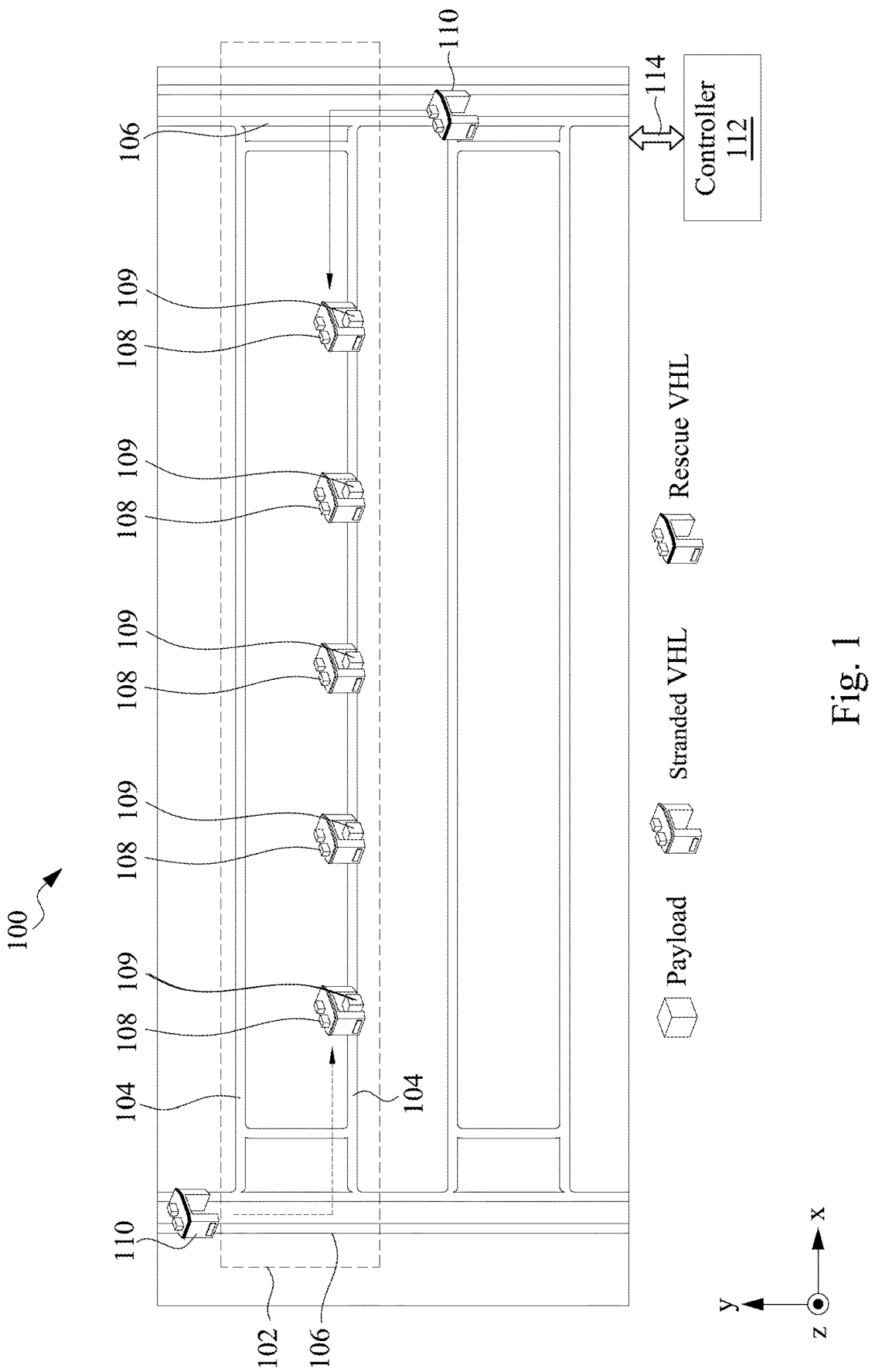
FIG. 1 is a top plan view of an equipment bay in a factory during a power outage, in accordance with some embodiments of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments of the present disclosure, the terms "about" and "substantially" can indicate a value of a given quantity that varies within 20% of the value (e.g., ±1%, ±2%, ±3%, ±4%, ±5±10%, ±20% of the value). These values are merely examples and are not intended to be limiting. The terms "about" and "substantially" can refer to a percentage of the values as interpreted by those skilled in relevant art(s) in light of the teachings herein.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

As wafer sizes have increased over time, integrated circuit manufacturing facility automation has become necessary to handle the increase in wafer size and weight. Consequently, re-tooling factories with larger equipment to handle larger wafers was accompanied by the installation of automated material handling systems (AMHSs). An AMHS automatically moves individual lots of semiconductor wafers around a factory and delivers each lot to and from process equipment under centralized control. An AMHS can be used to transport and deliver material other than wafers, for example, reticles.

The AMHS can transfer wafer lots in closed containers, or Front Opening Unified Pods (FOUPs), between different areas of the integrated circuit manufacturing facility. Likewise, reticles can be contained in a reticle pod (carrier), which are analogous to a FOUP for containing wafers. Other containers include a Front Opening Shipping Box (FOSB), a magazine, a frame cassette, and a tray cassette.

The various payloads (e.g., wafers) can be transported along an intra-bay track of an overhead hoist transport (OHT) system mounted to the ceiling of an integrated circuit manufacturing facility. The overhead hoist transport system extends throughout the facility, creating a rail system network. Payloads being transported can be placed into an overhead transport vehicle (e.g., a product vehicle) that travels along rails of the overhead transport, drawing power from the rail system (e.g., through inductive means). When the overhead transport vehicle reaches its destination, an overhead transport robot can unload the payload (e.g., FOUP) from the overhead transport vehicle and move the payload from the overhead transport vehicle to processing equipment located on the integrated circuit manufacturing facility's floor, along a vertical connector. Once the overhead transport robot delivers the payload to the process equipment, a robot associated with the process equipment unloads the payload (e.g., individual wafers from the FOUP) for processing.

Occasionally, a section of the AMHS may undergo repair, requiring power to that section of the rail system to be turned off. In some instances, a power outage or other system failure can affect sections of the AMHS. In a power-down situation, a FOUP may be stranded in an overhead transport vehicle along the track. Systems and methods as described herein provide solutions during such an event. For example, a rescue vehicle can be deployed to fetch a stranded overhead transport vehicle so that the FOUP in the stranded vehicle can be recovered and wafer processing can resume.

In addition to minimizing wafer processing disruptions during a power-down event, such a wafer-recovery operation may prevent quality degradation for time-critical sequences of processing operations.

An AMHS such as the one described herein may be operated under similar principles in a factory other than an integrated circuit manufacturing facility, such as, for example, a transportation system, a delivery system, an amusement park ride, or any other system that involves vehicles that could be stranded along a track. For example purposes, the embodiments herein are described in the context of an integrated circuit manufacturing facility.

FIG. 1 shows a snapshot in time of a partial map of an AMHS, according to some embodiments. An example rail system, overhead transport system 100, is configured to deliver material to process equipment (not shown) located within an area of an integrated circuit manufacturing facility, e.g., a bay 102 of the integrated circuit manufacturing facility. Bay 102 can be an aisle lined with rows of wafer processing equipment, e.g., deposition equipment for depositing layers of material on the wafers, etching equipment for etching patterns into various layers of material on the wafers, and metrology equipment for measuring film thickness, particle counts, and the like. Bay 102 provides access to wafer processing equipment for loading and unloading wafers using automated equipment, e.g., wafer transport robots. Overhead transport system 100 is aligned with a horizontal, x-y plane, as viewed from underneath, e.g., from the floor of the integrated circuit manufacturing facility, or from above, e.g., from a ceiling of the integrated circuit manufacturing facility, where the z-axis represents height above or below the facility's floor.

Overhead transport system 100 includes an intra-bay track 104, an inter-bay track 106, one or more overhead transport vehicles 108 (each with a payload 109), and one or more rescue vehicles 110. Overhead transport system 100 is coupled to a controller 112 via a communication path 114. Communication path 114 can be wired, wireless, or a combination of both wired and wireless connections. In some embodiments, communication path 114 can allow controller 112 to communicate with overhead transport vehicles 108 and/or rescue vehicles 110 via an on-board wireless communication device (e.g., transmitter/receiver). Overhead transport vehicle is also referred to herein as a "product vehicle."

A rectangular section of overhead transport system 100 forms intra-bay track 104 over bay 102 and is aligned with the length of bay 102. Intra-bay track 104 is connected to inter-bay tracks 106 located at the ends of bay 102. Inter-bay tracks 106 couple overhead transport system 100 to respective intra-bay tracks 104 of adjacent bays in the neighborhood of bay 102. Overhead transport vehicles 108 and rescue vehicles 110 travel along rails aligned with intra-bay track 104 and inter-bay tracks 106, which serve to guide vehicular motion. Overhead transport vehicles 108 can be loaded with payloads 109, e.g., FOUPs containing silicon wafers that have undergone processing at various stages of the integrated circuit manufacturing facility. Additionally or alternatively, overhead transport vehicles 108 can be loaded with reticles, or some other payload. Some overhead transport vehicles 108 may be empty, while others are full.

In FIG. 1, a section of overhead transport system 100 has lost power and is referred to as a "powered down area." Overhead transport vehicles 108 (five shown) that are delivering wafers to bay 102 for processing have been stranded and cannot proceed to their destinations. In the scenario shown in FIG. 1, overhead transport system 100 detects a power outage and responds by deploying one or more rescue vehicles 110 (two shown) to bay 102. As will be described below and in some embodiments, rescue vehicles 110, unlike overhead transport vehicles 108, are self-powered. Overhead transport system 100 is an improvement over other AMHSs that manually unload the payload from each overhead transport vehicle in a powered down area and then transfer the overhead transport vehicle to another section of the AMHS that is unaffected by the power outage.

Figure 2:
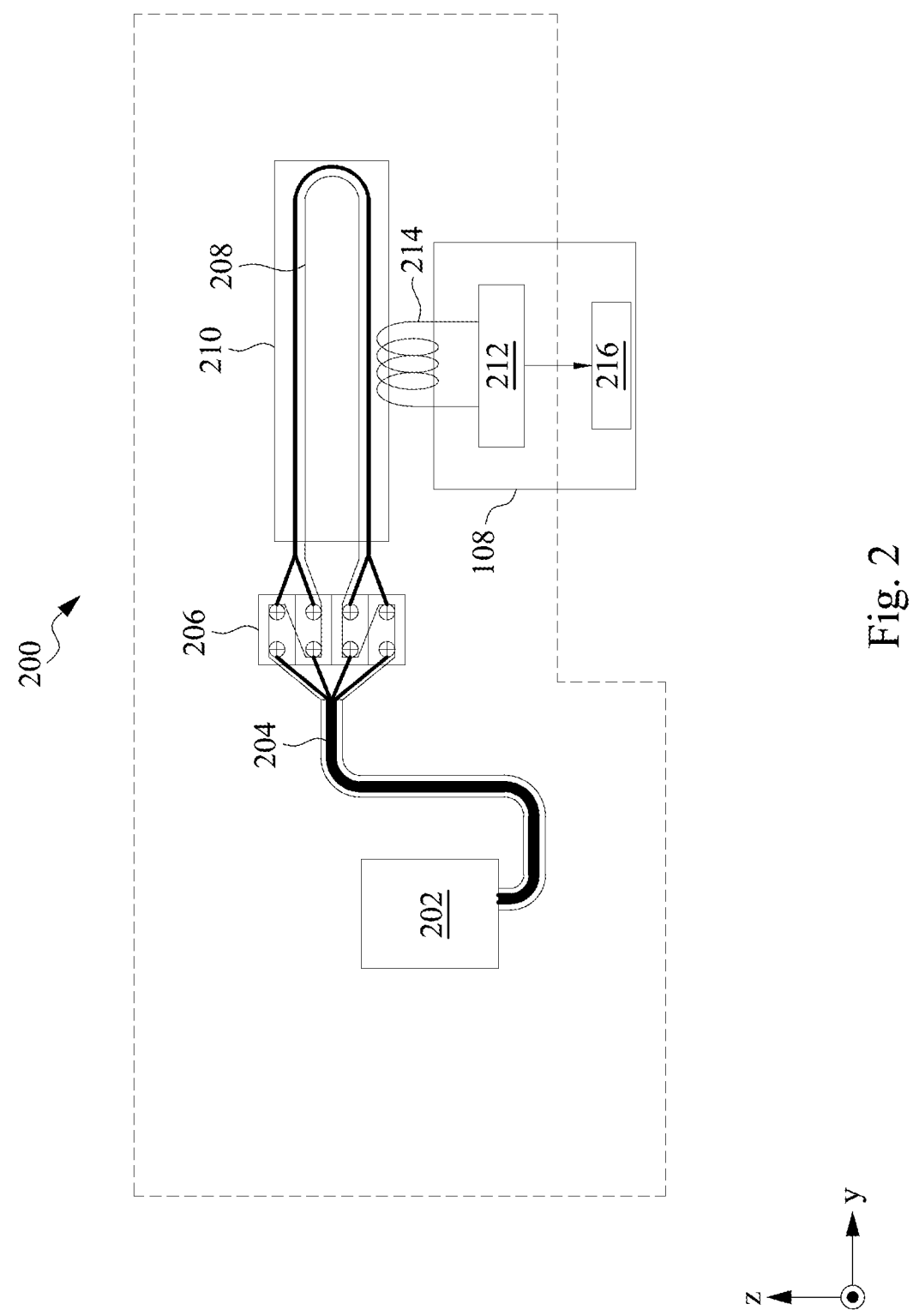
FIG. 2 is a block diagram of a rail power architecture, in accordance with some embodiments of the present disclosure.

FIG. 2 shows a rail power architecture 200 that can be implemented to service bay 102, according to some embodiments. Rail power architecture 200 includes overhead transport vehicle 108, a power source 202, a non-inductive cable 204, a terminal block 206, a rail 208, and an induction cable 210 mounted to rail 208. Within overhead transport vehicle 108, rail power architecture 200 further includes a power supply board 212, an induction coil 214, and electromotive components 216. Rail power architecture 200 supplies rail power from power source 202 to overhead transport vehicles 108 via inductive coupling means.

Power source 202 can be fed from a main power supply in the integrated circuit manufacturing facility. In some embodiments, power source 202 is fed from a sub-station exclusively servicing the integrated circuit manufacturing facility so the facility will not be vulnerable to outages occurring in a local city or in neighboring industrial facilities. In some embodiments, power source 202 feeds power to one or more bays 102. By providing a separate power source 202 to each bay 102 or to each area of the integrated circuit manufacturing facility, localized areas can be isolated so that the effect of a fault is limited, e.g., to one bay or to a few bays. With sufficient redundancy, or duplication of equipment, the integrated circuit manufacturing facility can maintain its operations even if power is interrupted to a single bay or to a localized area of the integrated circuit manufacturing facility.

Non-inductive cable 204 couples power source 202 to one side of terminal block 206. Rail 208 and induction cable 210, which extend throughout bay 102, are coupled to an opposite side of terminal block 206. Terminal block 206 provides a switching station platform that allows selective coupling and de-coupling power from power source 202 to bay 102.

Power supply board 212 couples to induction cable 210 via induction coil 214. Inductive coupling allows overhead transport vehicle 108 to move freely along rail 208 while drawing rail power from induction cable 210. Within overhead transport vehicle 108, power supply board 212 routes rail power to electromotive components 216, which can include an on-board electric motor that applies a force to move overhead transport vehicle 108 relative to rail 208. Electromotive components 216 can further include power supply generators (shown in FIG. 3) that increase the inductive power received by induction coil 214 to drive the on-board electric motor.

FIG. 3 shows a magnified view of overhead transport vehicle 108, in accordance with some embodiments. Referring to FIGS. 1, 2, and 3, overhead transport vehicle 108 is attached to a track 104/106 that can be either intra-bay track 104 or inter-bay track 106. Track 104/106 is suspended from the ceiling of the integrated circuit manufacturing facility by mounting brackets 302. Rail 208 and induction cable 210 are concealed within track 104/106. Power supply board 212 is concealed within overhead transport vehicle 108. Power supply board 212 supplies rail power to a first power supply 304 and a second power supply 306, which are electromagnetic generators that generate sufficient electric power to move overhead transport vehicle 108 along track 104/106. A central compartment of overhead transport vehicle 108—behind a cover panel 308 and between power supplies 304 and 306—accommodates a payload and robot arms that can be programmed to extend downward, in the −z direction, to lift a payload vertically into overhead transport vehicle 108 and to deliver the payload to a load station of a process equipment module in the integrated circuit manufacturing facility. As explained above, overhead transport vehicles 108 can have different designs suitable for different types of payloads.

Figure 4:
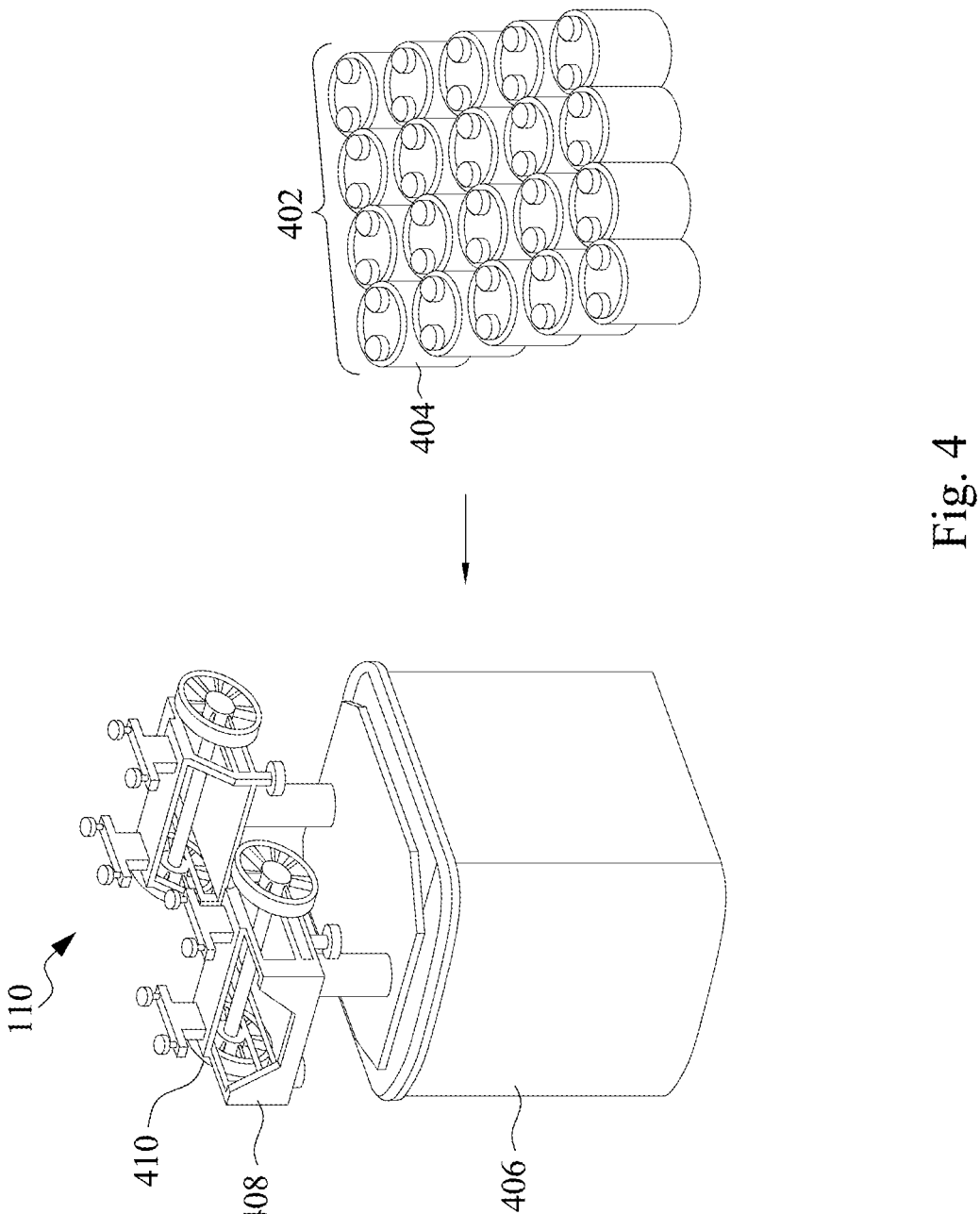
FIG. 4 is a pictorial view of the exterior of a rescue vehicle configured to accept a battery payload, in accordance with some embodiments of the present disclosure.

FIG. 4 illustrates rescue vehicle 110, according to some embodiments. In some embodiments, rescue vehicle 110 can be self-powered and include a battery payload 402 made up of one or more batteries 404, a rescue carrier 406, a rail attachment assembly 408, and wheels 410. In some embodiments, rescue vehicle 110 can be a dedicated overhead transport vehicle adapted to carry battery payload 402 instead of payload 109. Battery payload 402 can be loaded and unloaded by extendable and retractable robot arms of rescue carrier 406, in the same way that payload 109 is loaded and unloaded from overhead transport vehicle 108 as described above. In some embodiments, rescue vehicle 110 can be used as an overhead transport vehicle that carries payload 109 under normal conditions (e.g., when overhead transport system 100 has power). When a power outage occurs, controller 112 can instruct rescue vehicle 110 to switch from operating as an overhead transport vehicle to being a rescue vehicle by substituting battery payload 402 for payload 109. In some embodiments, any overhead transport vehicle 108 can be reconfigured as a rescue vehicle 110 upon swapping payload 109 (e.g., FOUP) for battery payload 402.

Battery payload 402 includes one or more batteries 404. In some embodiments, battery 404 is rechargeable, e.g., a capacitor cell, and can be coupled to power supply board 212 for recharging from rail power via induction cable 210. Battery payload 402 occupies the space within rescue vehicle 110 that payload 109 occupies in overhead transport vehicle 108, according to some embodiments.

A number of individual batteries 404 in battery payload 402 can be determined prior to deployment of rescue vehicle 110 by, for example, computing an amount of battery power needed to move rescue vehicle 110 from a point of origin to its destination, e.g., at bay 102, and back to the point of origin. The location where battery power would switch on can correspond to the first non-powered rail in overhead transport system 100 that rescue vehicle 110 encounters when moving toward bay 102. According to some embodiments, the size of battery payload 402 can be adjusted according to what is needed to access the affected location. For example, if the region affected by the power outage is small and only one or two overhead transport vehicles 108 need to be rescued, fewer batteries can be loaded and, with less weight, rescue vehicle 110 can move faster and more efficiently throughout the rescue operation. This could be advantageous if there is a time constraint on the delay between processing steps for the payload wafers.

Alternatively, a range, or maximum distance of travel, of rescue vehicle 110 can be computed from the maximum battery power associated with a maximum number of batteries in battery payload 402 (e.g., based on the maximum size of battery payload 402) that fits within rescue vehicle 110, and an estimated velocity of travel. The maximum number of batteries that can be carried in battery payload 402 is limited by the interior volume of rescue vehicle 110. For example, a FOUP can occupy a volume of about 390 mm×325 mm×323 mm, or about 42,200 cm³. In some embodiments, battery 404 can be an aluminum electrolytic capacitor having the following characteristics: a volume of about 400 cm³ and a capacitance of about $1.5 \times 10^4$ μF; and, during operation, a voltage of about 315 V at a current of about 1.5 A. In some embodiments, battery 404 can supply a voltage of at least about 315 V. When the FOUP is replaced by battery payload 402 of equivalent volume, a maximum number of batteries 404 that can be packaged in battery payload 402 within rescue vehicle 110 is 42,200/400=105, according to some embodiments.

In some embodiments, the maximum travel time t of rescue vehicle 110 provided by 105 batteries (e.g., batteries 404) can be calculated from the capacitor equation, q=CV, where q is the charge stored in the capacitor, C is the capacitance (e.g., battery 404), and V is the voltage. Maximum travel time t is then given by $t=CV/I=(1.5 \times 10^{-2} \text{ F})(315 \text{ V})/1.5 \text{ A}=3$ sec/capacitor×105 capacitors=315 seconds, or about 5 minutes. At an estimated velocity of about 1 meter/sec, the distance range of rescue vehicle 110 provided by 105 batteries is about 315 meters.

Thus, when rescue vehicle 110 is deployed, it will have a time limit of about 5 minutes to tow one or more overhead transport vehicles 108 from a powered down area in overhead transport system 100 to an area of overhead transport system 100 with power. Because battery payload 402 can be continuously or periodically recharged from rail power on the way to and from bay 102, the full 315 meter range during the 5 minute time interval can be made available for use once rescue vehicle 110 reaches the powered down area. During the rescue operation, a controller (e.g., controller 112 of FIG. 1) can periodically calculate the remaining operation time and available backup power. If insufficient battery power remains, the controller can command rescue vehicle 110 to return to a location where rail power is available to recharge battery payload 402.

An exterior shell of rescue carrier 406 protects battery payload 402 and couples to rail attachment assembly 408. In some embodiments, rail attachment assembly 408 surrounds a portion of rail 208 so that rescue carrier 406 is suspended from rail 208. In some embodiments, wheels 410 serve to stabilize the coupling of rail attachment assembly 408 to rail 208 and to guide translational motion of rescue vehicle 110 along rail 208.

Figures 5A, 5B:
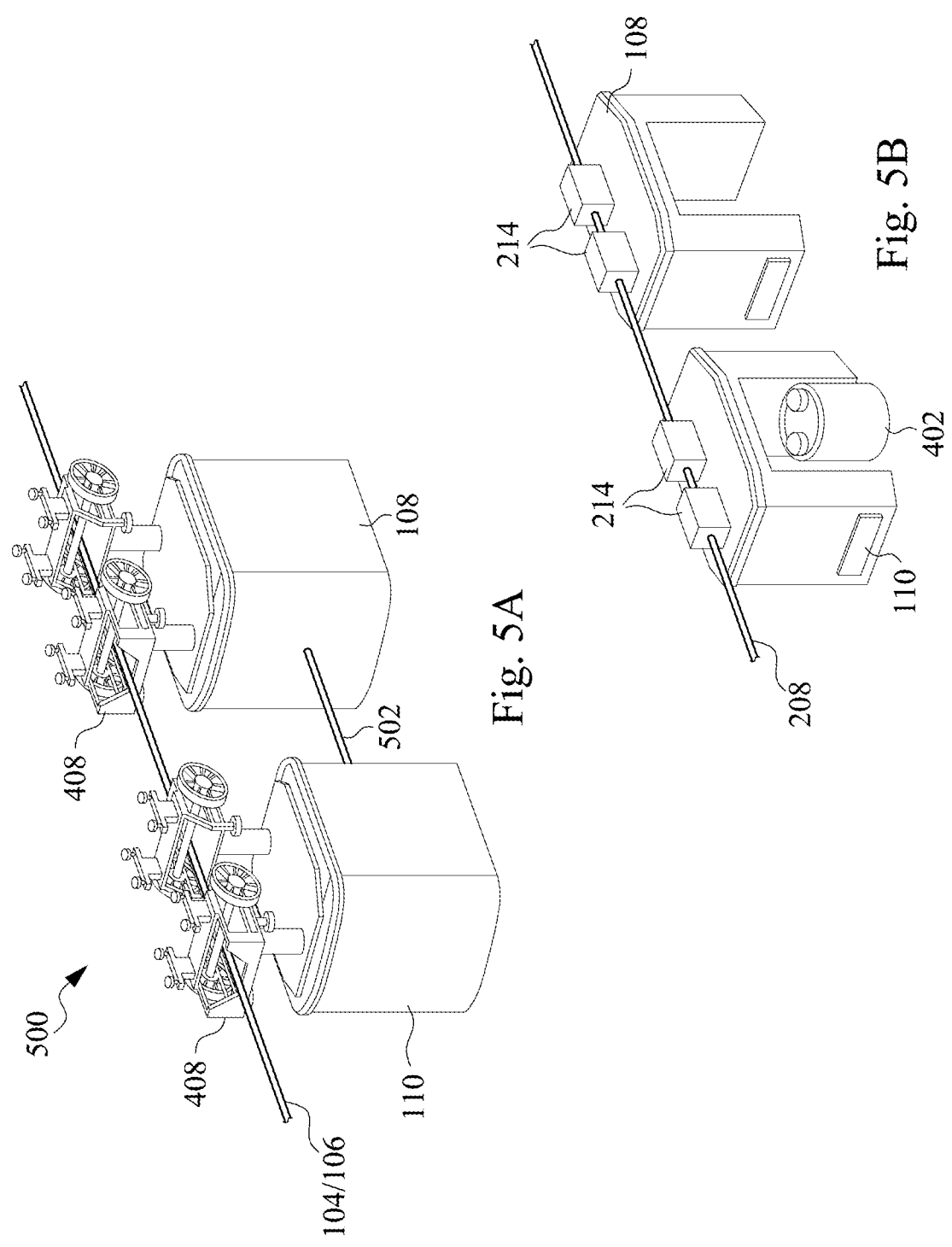
FIGS. 5A and 5B are pictorial perspective views of a rescue vehicle and an overhead transport vehicle during a rescue operation, in accordance with some embodiments of the present disclosure.

FIGS. 5A and 5B illustrate rescue system components 500 involved in a rescue operation, according to some embodiments. Rescue system components 500 include overhead transport vehicle 108, rescue vehicle 110, track 104/106, rail 208, rail attachment assembly 408 and a connector 502.

FIG. 5A shows an exterior view of system components 500 and the mechanical coupling of vehicles 108 and 110 to each other and to tracks 104/106 that guide motion of overhead transport vehicle 108/rescue vehicle 110. During the rescue operation, rescue vehicle 110 extends connector 502 to form a link with overhead transport vehicle 108. Using connector 502, rescue vehicle 110 can capture a stranded or malfunctioning overhead transport vehicle 108 and tow it away from the powered down area. In some embodiments, connector 502 is rigid so that rescue vehicle 110 can either push or pull overhead transport vehicle 108. In some embodiments, connector 502 can be stored inside rescue vehicle 110 when not in use. In some embodiments, connector 502 can be expandable for towing and collapsible for storage. In some embodiments, rescue vehicle 110 can be equipped with a connector 502 on each end for maximum flexibility to be able to tow an overhead transport vehicle 108 on either end of rescue vehicle 110. In some embodiments, connector 502 can be secured to an outside surface of overhead transport vehicle 108, e.g., by suction, by a hook, by a socket built into the shell of overhead transport vehicle 108, or by any another suitable attachment device, thus allowing rescue vehicle 110 to tow overhead transport vehicle 108.

Connector 502 can include sensors to detect when a link between rescue vehicle 110 and overhead transport vehicle 108 has been established, according to some embodiments. Such sensors can be coupled to a transmitter to transmit a status signal to controller 112 of FIG. 1. In addition, in some embodiments, connector 502 can be equipped with a pedometer to measure distances traveled while rescue vehicle 110 uses battery power. When the distance traveled indicates an imminent loss of battery power, an alert can be transmitted to controller 112 so that rescue vehicle 110 can be advanced to a powered area of rail 208 for re-charging.

FIG. 5B shows interior views of vehicle 108 and rescue vehicle 110 and the electrical coupling of the vehicles to rail 208 via induction coils 214, according to some embodiments. FIG. 5B also shows a payload status of the vehicles during a rescue operation. For example, overhead transport vehicle 108 can be empty, while rescue vehicle 110 is loaded with battery payload 402. While the rescue operation is underway, rescue vehicle 110 relies on self-power from battery payload 402 to tow overhead transport vehicle 108 until a powered section of rail 208 is reached. When overhead transport vehicle 108 is empty, less battery power is consumed by rescue vehicle 110 and the towing distance range can be greater. When rail power is available again, overhead transport vehicle 108 can be re-directed (e.g., by controller 112 of FIG. 1) to resume collecting and delivering goods, while rescue vehicle 110 draws inductive power from rail 208 to re-charge battery payload 402.

When overhead transport vehicle 108 has payload 109 (e.g., a FOUP or other container) and power is lost, overhead transport vehicle 108 cannot communicate payload information to controller 112. In some embodiments, during a rescue operation, connector 502 can be equipped to read payload information about the contents of payload 109, such as wafer lot information on bar codes located on the FOUP, and transfer the payload information to rescue vehicle 110. In some embodiments, the payload information can be transmitted to controller 112 by rescue vehicle 110. When the rescue operation is completed and overhead transport vehicle 108 is reconnected to rail power, controller 112 can transfer the payload information to overhead transport vehicle 108. Overhead transport vehicle 108 needs accurate information regarding its destination and payload identification to resume operation following a restoration of power. Controller 112 can also retain the payload information. Keeping a record of which wafers are delayed by the power outage may be important if a quality control issue should arise at a later time.

FIG. 6 is a flow chart of a method 600 to monitor a powered down incident in overhead transport system 100 and, in response, to direct a rescue operation, according to some embodiments. Method 600 can be executed by controller 112 of FIG. 1. Referring to FIG. 1, in response to commands received from controller 112 via communication path 114, rescue vehicle 110 can carry out one or more operations of method 600, according to some embodiments.

Additional operations can be performed between the various operations of method 600 and are omitted for simplicity. These additional operations are within the spirit and the scope of this disclosure. Moreover, not all operations may be required to perform the disclosure provided herein.

Additionally, some of the operations can be performed simultaneously or in a different order than the ones shown in FIG. 6.

Referring to FIG. 6, in operation 602, a power outage is detected, according to some embodiments. In the example described herein, the power outage affects a powered down area within an integrated circuit manufacturing facility that is isolated to a specific area of the facility, for example, bay 102 of FIG. 1. Power status information of the rail system can be transmitted to controller 112 from various sources of detection. For example, a power outage can be sensed by monitoring changes in the load on power sources 202 that supply individual bays or areas of the integrated circuit manufacturing facility. Additionally or alternatively, a power outage can be noticed by a human operator and reported to controller 112. In some embodiments, a power outage can be sensed by rescue vehicle 110 near the powered down area. For example, when rail power becomes unavailable, rescue vehicle 110 can switch to battery power (e.g., via battery payload 402), thus indicating a power outage.

Referring to FIG. 6, in operation 604, overhead transport vehicles 108 that are located in the powered down area are detected, according to some embodiments. In some embodiments, overhead transport vehicles 108 communicate periodically with controller 112 and when such communication is interrupted, controller 112 can interpret the interruption as overhead transport vehicle being located in the powered down area. Additionally or alternatively, stranded overhead transport vehicles 108 can be reported to controller 112 by a human operator.

Referring to FIG. 6, in operation 606, controller 112 can be programmed to perform power and/or range calculations, in accordance with some embodiments. The power and/or range calculations can be similar to those described above. Power and range calculations can help controller 112 select the closest rescue vehicle to the power outage and ensure the selected rescue vehicle has sufficient battery power to perform the rescue operation. The power and range calculations can include an assessment of the area affected by the power outage and the number of overhead transport vehicles affected. Power and range calculations can be based on rail status information transmitted to controller 112 from various sources as described above.

Referring to FIG. 6, in operation 608, one or more rescue vehicles 110 are deployed to the powered down area, according to some embodiments. When a power outage to a portion of the rail is detected, rescue vehicles can receive wireless communication alerts from controller 112. In response, rescue vehicle 110 traverses the rail system under battery power toward a powered down area of OHT 100 where one or more stranded overhead transport vehicles 108 is located. In some embodiments, rescue vehicles 110 can remain stationary until they are summoned by controller 112. For example, rescue vehicles 110 can be corralled in a depot with battery payloads 402 pre-loaded so that rescue vehicles 110 are ready to be deployed on command from controller 112. In some embodiments, rescue vehicles 110 can circulate around the integrated circuit manufacturing facility with their battery payloads already loaded so as to be closer to their destinations when a power outage occurs. In some embodiments, overhead transport vehicles 108 with no payloads when a power outage occurs can be converted to rescue vehicles 110 by accepting battery payloads 402.

Referring to FIG. 6, in an optional operation 610, an overhead transport vehicle 108 that is disabled by the power outage while carrying goods can be unloaded prior to being rescued, according to some embodiments. Although an overhead transport vehicle 108 with payload 109 can be towed away from the powered down area by a rescue vehicle 110, it may be more energy efficient to unload overhead transport vehicle 108 first so it is empty (and thus lighter) during the rescue operation. That is, an empty overhead transport vehicle 108 will drain significantly less battery power from the battery payload 402 of rescue vehicle 110. Once the power is cut off to overhead transport vehicle 108, it cannot be unloaded in an automated fashion, e.g., using robots. In some embodiments, unloading payload 109 from overhead transport vehicle 108 may require human intervention before resuming an automated recovery procedure using rescue vehicle 110 (operating on battery payload 402).

Referring to FIG. 6, in operation 612, rescue vehicle 110 links with overhead transport vehicle 108 via connector 502, according to some embodiments. In some embodiments, rescue vehicle 110 extends connector 502 toward overhead transport vehicle 108. Mechanical coupling between the two vehicles can be accomplished as described above with reference to FIG. 5A, using different types of coupling devices, e.g., a suction device, hooks, a magnetic device, retractable pins attached to connector 502 that fit into a socket on overhead transport vehicle 108, and any another suitable attachment means.

Referring to FIG. 6, in operation 614, rescue vehicle 110 tows overhead transport vehicle 108 away from the powered down area, according to some embodiments. With reference to FIG. 5A, the towing operation can be facilitated by having reliable connection points at either end of the connector 502. When rescue vehicle 110 senses the presence of rail power, the towing procedure can stop so that overhead transport vehicle 108 can re-establish its power connection and execute a re-boot routine to reset its wireless connectivity in preparation for communication with controller 112.

Referring to FIG. 6, in operation 616, overhead transport vehicle 108 couples to rail 208, according to some embodiments. When the tow procedure is complete and overhead transport vehicle 108 has access to a powered rail 208, overhead transport vehicle 108 can re-establish its inductive coupling and also its communication with controller 112. Once a communications handshake is performed to confirm normal communication and location tracking, controller 112 can assign a new destination to overhead transport vehicle 108 and refresh its payload information so that normal operations can resume.

Referring to FIG. 6, in operation 618, controller 112 can instruct rescue vehicle 110 to de-couple from overhead transport vehicle 108 and returns to its point of origin, according to some embodiments. When overhead transport vehicle 108 is back online, rescue vehicle 110 can retract connector 502 and store connector 502 inside the housing of rescue vehicle 110. In some embodiments, connector 502 can collapse down to a smaller size, e.g., by telescoping, compressing a spring, or a similar method of reduction. When rescue vehicle 110 is decoupled from overhead transport vehicle 108, rescue vehicle 110 can return to its normal operation while simultaneously recharging battery payload 402 from rail power. If rescue vehicle 110's normal operation is to circulate throughout the factory continuously while waiting for another rescue procedure, rescue vehicle 110 can temporarily remain stationary so as to accelerate charging battery payload 402.

Figure 7:
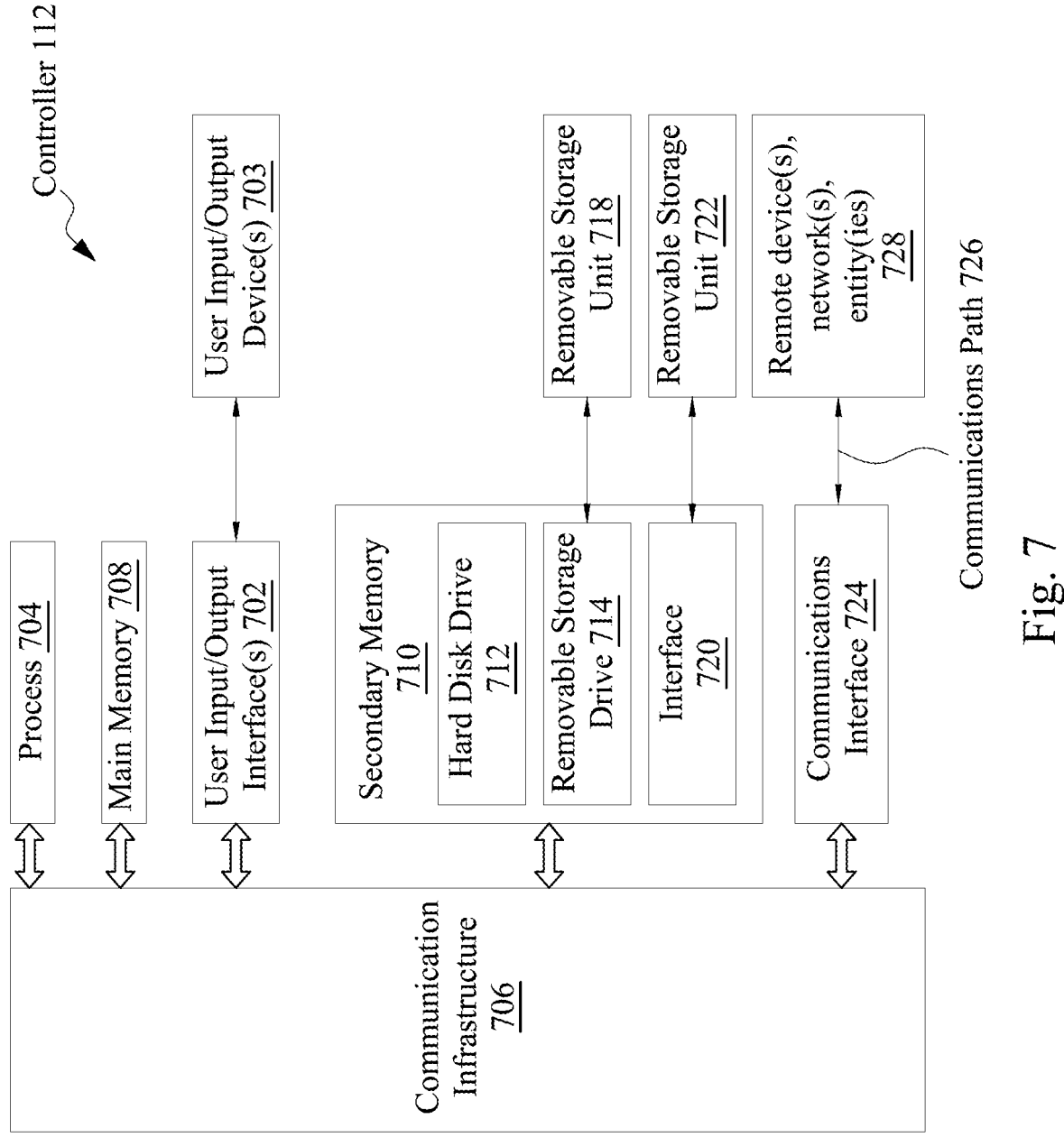
FIG. 7 is a block diagram of a controller configured to carry out the method shown in FIG. 6, in accordance with some embodiments of the present disclosure.

FIG. 7 is a block diagram of a computer system that can serve as controller 112 of FIG. 1, to implement various embodiments of the present disclosure. The computer system of FIG. 7 can be any well-known computer capable of performing the functions and operations described herein.

For example, and without limitation, the computer system of FIG. 7 can be implemented as controller 112 to serve as a command module capable of directing power outage recovery involving one or more rescue vehicles 110. The computer system of FIG. 7 can be used, for example, to execute one or more operations in method 600 of FIG. 6, which describes an example method for recovering stranded overhead transport vehicles 108. In some embodiments, one or more components of the computer system of FIG. 7 can be housed in rescue vehicle 110. In some embodiments, the computer system of FIG. 7 can include a main controller at a fixed location in the factory, with an external wireless communication link, e.g., communication path 114, to components located on board rescue vehicle 110.

The computer system of FIG. 7 includes one or more processors (also called central processing units, or CPUs), such as a processor 704. Processor 704 is connected to a communication infrastructure or internal bus 706. The computer system of FIG. 7 also includes input/output device(s) 703, such as monitors, keyboards, pointing devices, etc., that communicate with communication infrastructure or internal bus 706 through input/output interface(s) 702. A rescue vehicle 110 can receive instructions to implement functions and operations described herein—e.g., method 600 of FIG. 6—via input/output device(s) 703. The computer system of FIG. 7 also includes a main or primary memory 708, such as random access memory (RAM). Main memory 708 can include one or more levels of cache. Main memory 708 has stored therein control logic (e.g., computer software) and/or data. In some embodiments, the control logic (e.g., computer software) and/or data can include one or more of the operations described above with respect to method 600 of FIG. 6.

The computer system of FIG. 7 can also include one or more secondary storage devices Or memory 710. Secondary memory 710 can include, for example, a hard disk drive 712 and/or a removable storage device or drive 714. Removable storage drive 714 can be a floppy disk drive, a magnetic tape drive, a compact disk drive, an optical storage device, tape backup device, and/or any other storage device/drive.

Removable storage drive 714 can interact with a removable storage unit 718. Removable storage unit 718 includes a computer usable or readable storage device having stored thereon computer software (control logic) and/or data. Removable storage unit 718 can be a floppy disk, magnetic tape, compact disk, DVD, optical storage disk, and/any other computer data storage device. Removable storage drive 714 reads from and/or writes to removable storage unit 718 in a well-known manner.

According to some embodiments, secondary memory 710 can include other means, instrumentalities or other approaches for allowing computer programs and/or other instructions and/or data to be accessed by the computer system of FIG. 7. Such means, instrumentalities or other approaches can include, for example, a removable storage unit 722 and an interface 720. Examples of the removable storage unit 722 and the interface 720 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 710, removable storage unit 718, and/or removable storage unit 722 can include one or more of the operations described above with respect to method 600 of FIG. 6.

The computer system of FIG. 7 can further include a communication or network interface 724. Communication interface 724 enables the computer system of FIG. 7 to communicate and interact with any combination of remote devices, remote networks, remote entities, etc. (individually and collectively referenced by reference number 728). For example, communication interface 724 can allow the computer system of FIG. 7 to communicate with remote devices 728 over communications path 726, which can be wired and/or wireless, and which can include any combination of LANs, WANs, the Internet, etc. Control logic and/or data can be transmitted to and from the computer system of FIG. 7 via communication path 726.

The operations in the preceding embodiments can be implemented in a wide variety of configurations and architectures. Therefore, some or all of the operations in the preceding embodiments—e.g., method 600 of FIG. 6—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, the computer system of FIG. 7, main memory 708, secondary memory 710 and removable storage units 718 and 722, as well as tangible articles of manufacture embodying any combination of the foregoing. Such control logic, when executed by one or more data processing devices (such as the computer system of FIG. 7), causes such data processing devices to operate as described herein.

Controller 112, as described above with respect to FIG. 7, thus can be programmed to direct a rescue operation during a power outage. By substituting a battery payload for a product payload, an overhead transport vehicle can be converted to a self-powered rescue vehicle capable of operating within a powered down area. When the rescue operation is completed, the rescue vehicle can return to a powered rail and recharge the battery payload. A fully automated rescue operation eliminates the need for human intervention during a power outage and ensures an efficient return to normal operations when power is restored. Product safety can also be enhanced by such an automated rescue operation, since stranded product vehicles can be rescued without being unloaded.

In some embodiments, a method includes: detecting a powered down area of a rail system; traversing the rail system under battery power toward a product vehicle within the powered down area; extending a connector to mechanically link to the product vehicle; and towing the product vehicle away from the powered down area.

In some embodiments, a rescue vehicle includes: a rescue carrier configured to draw electric power from either an inductive source or a battery source; a rail attachment assembly configured to couple the rescue carrier to a rail for translational motion along the rail; and a connector configured to attach to a product vehicle to tow the product vehicle along the rail in response to the rail losing power.

In some embodiments, a material handling system includes: a rail; a rescue vehicle coupled to the rail and configured to draw power from either the rail or an on-board battery; and a controller configured to: detect a powered down area of the rail; detect presence of a product vehicle within the powered down area; deploy the rescue vehicle from a point of origin to the powered down area to rescue the product vehicle; receive payload information about the product vehicle; instruct the rescue vehicle to switch between rail power and battery power; and instruct the rescue vehicle to return to the point of origin.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
detecting a powered down area of a rail system;
traversing the rail system, under battery power, toward a product vehicle within the powered down area;
extending a connector to mechanically link to the product vehicle; and
towing the product vehicle away from the powered down area.

2. The method of claim 1, further comprising, after the product vehicle is coupled to a powered rail of the rail system, de-coupling a rescue vehicle from the product vehicle.

3. The method of claim 1, further comprising:
retrieving payload information from the product vehicle; and
transmitting the payload information to a controller.

4. The method of claim 3, wherein retrieving the payload information comprises retrieving payload information from one or more of a wafer carrier, a shipping box, a magazine, a frame cassette, and a tray cassette.

5. The method of claim 3, wherein retrieving the payload information comprises retrieving payload information from a reticle carrier.

6. The method of claim 1, further comprising loading a battery payload.

7. The method of claim 6, wherein the battery payload comprises one or more capacitor cells configured to supply a pre-determined amount of power.

8. The method of claim 6, further comprising recharging the battery payload from a powered rail.

9. A rescue vehicle, comprising:
a power supply board;
an inductive source comprising an induction coil;
a rescue carrier configured to draw electric power from either the inductive source or a battery source coupled to the power supply board;
a rail attachment assembly configured to couple the rescue carrier to a rail for translational motion along the rail; and
a connector configured to attach to a product vehicle to tow the product vehicle along the rail, wherein the connector comprises:
an arm configured to extend towards the product vehicle;
an attachment device configured to secure the arm to the product vehicle;
one or more sensors configured to sense when the product vehicle is attached to the rescue vehicle; and
a pedometer configured to monitor a distance traveled along the rail.

10. The rescue vehicle of claim 9, further comprising a wireless communication device.

11. The rescue vehicle of claim 10, wherein the wireless communication device is configured to receive alerts signaling loss of power to a portion of the rail.

12. The rescue vehicle of claim 9, wherein the power supply board is configured to draw electric power from the rail by induction through the induction coil.

13. The rescue vehicle of claim 9, wherein the connector is configured to attach to a product vehicle to tow the product vehicle along the rail in response to the rail losing power.

14. The rescue vehicle of claim 13, wherein the connector is configured to retract and collapse from a first size to a second size smaller than the first size.

15. The rescue vehicle of claim 9, wherein the connector is configured to retract and collapse from a first size to a second size smaller than the first size.

16. A material handling system, comprising:

a rail;

a rescue vehicle coupled to the rail and configured to draw power from either the rail or an on-board battery; and a controller configured to:

detect a powered down area of the rail;

detect presence of a product vehicle within the powered down area;

deploy the rescue vehicle from a point of origin to the powered down area to rescue the product vehicle;

receive payload information about the product vehicle;

instruct the rescue vehicle to switch between rail power and battery power; and instruct the rescue vehicle to return to the point of origin.

17. The material handling system of claim 16, wherein receiving the payload information comprises receiving information about one or more of semiconductor wafers and reticles.

18. The material handling system of claim 16, wherein the controller is further configured to:

compute an energy requirement needed for the rescue vehicle to rescue the product vehicle; and size the on-board battery based on the computed energy requirement.

19. The material handling system of claim 16, wherein the controller is further configured to:

compute a distance range based on a maximum battery capacity;

compute a time limit for a rescue operation; and instruct the rescue vehicle to recharge a battery payload within the time limit.

20. The material handling system of claim 16, wherein the controller comprises a computer system configured to transmit instructions to the rescue vehicle via a wireless communication path.

* * * * *